United States Patent [19]

Brown et al.

[11] Patent Number: 4,623,556

[45] Date of Patent: Nov. 18, 1986

[54] METHOD OF FORMING A CONTINUOUS GLASS COATING OVER THE SURFACE OF AN ELECTRICAL DEVICE

[75] Inventors: Richard Brown, Berkeley Heights; Franco N. Sechi, Princeton Township, Mercer County, both of N.J.

[73] Assignee: RCA Corporation, Princeton, N.J.

[21] Appl. No.: 815,393

[22] Filed: Dec. 31, 1985

[51] Int. Cl.$^4$ .............................................. H05K 3/28
[52] U.S. Cl. ..................................... 427/41; 156/643; 427/96; 427/376.2
[58] Field of Search .................. 427/41, 96, 376.2; 156/643

[56] References Cited

U.S. PATENT DOCUMENTS

| | | | |
|---|---|---|---|
| 3,935,330 | 1/1976 | Smith et al. | 427/41 |
| 4,201,579 | 5/1980 | Robinson et al. | 430/323 |
| 4,241,165 | 12/1980 | Hughes et al. | 430/269 |
| 4,341,820 | 7/1982 | Taylor | 427/376.2 |
| 4,401,709 | 8/1983 | Prabhy | 427/96 |
| 4,555,303 | 11/1985 | Leggs | 156/643 |

OTHER PUBLICATIONS

M. Leahy, "Plasma Etching for Integrated Circuit Fabrication," *RCA Engineer*, 30-5, Sep./Oct. 1985, pp. 75-82.

*Primary Examiner*—John D. Smith
*Attorney, Agent, or Firm*—Birgit E. Morris

[57] ABSTRACT

A method is disclosed for forming a continuous glass coating which is free of pinholes, cracks, and the like over the surface of an electrical device. In the method disclosed, a mixture consisting essentially of an organic vehicle which is reactive with a suitable plasma to form gaseous reaction products at a temperature below the thermal decomposition temperature of the organic vehicle and a glass frit having a glass transition temperature above the thermal degradation temperature is applied in a layer over the surface of a completed electrical device. The applied layer of the mixture is then subjected to a suitable plasma at a temperature below the thermal degradation temperature of the organic vehicle for a time sufficient to remove the organic vehicle from the layer. The layer is then heated to or above the glass transition temperature of the glass frit until the glass frit fuses and forms a continuous defect-free glass coating over the surface of the electrical device.

6 Claims, No Drawings

METHOD OF FORMING A CONTINUOUS GLASS COATING OVER THE SURFACE OF AN ELECTRICAL DEVICE

The Government has rights in this invention pursuant to Contract No. F33615-84-C-1449 awarded by the Department of the Air Force.

This invention relates to a novel method for forming a continuous glass coating over the surface of an electrical device and more particularly is concerned with forming a defect-free glass coating for hermetically sealing and encapsulating an electrical device.

BACKGROUND OF THE INVENTION

In the manufacture of electrical devices such as integrated circuits and the like it is conventional practice to protect the finished device by hermetically sealing the surface of the device and encapsulating the finished device in a protective coating. The same coating of material is preferably used to both hermetically seal and encapsulate the electrical devices.

The coatings used for hermetic sealing and for encapsulation must be highly adherent to the electrical device, be free of defects such as cracks, pinholes, and the like and must be durable under a wide range of conditions of humidity and temperature.

Various materials have been suggested for use in hermetic sealing and encapsulating electrical devices. Certain plastics such as the polyimides are widely used but plastics tend to have pinholes and are not as durable as is required for many applications. It has also been suggested to use chemically vapor deposited glasses on the devices but this is expensive and the results are often somewhat erratic.

It has also been suggested to use mixtures of glass frit and an organic binder to form an initial layer on the electrical device. The organic binder is then burnt out and the glass frit is fused into what should be a continuous coating. This method has, however, not proven to be successful in that residual organic materials from the organic binder often remain in the fired glass frit and cause defects such as voids, pinholes, and discontinuities in the coating which make the final coating unsuitable for hermetic sealing and for protecting the electrical device.

What would be highly desirable would be a reliable method for forming continuous glass coatings which would hermetically seal and protectively encapsulate electrical devices.

SUMMARY OF THE INVENTION

A method is disclosed for forming a continuous glass coating which is free of pinholes, cracks and the like over the surface of electrical devices. In the disclosed method, a mixture consisting essentially of (i) an organic vehicle which will react with a suitable plasma to form gaseous reaction products at a temperature below the thermal decomposition temperature of the organic vehicle and (ii) a glass frit having a glass transition temperature above the thermal degradation temperature of the organic vehicle is applied in a layer over the surface of a completed electrical device. The layer is then subjected to a suitable plasma at a temperature below the thermal degradation temperature of the organic vehicle for a time sufficient to remove the organic vehicle from the layer. The layer is then heated to or above the glass transition temperature of the glass frit until the glass fuses and forms a continuous defect-free glass coating over the surface of the electrical device.

DETAILED DESCRIPTION OF THE INVENTION

The mixtures of glass frit and organic vehicle which are useful in the method of this invention can readily be formulated from commercially available materials or can be purchased in combination from various commercial sources. The mixtures used in this invention are comprised of an intimate mixture of an organic vehicle and a glass frit.

The organic vehicles contain a binder to hold the glass frit particles together on the surface of the electrical device prior to firing. Resinous, film-forming materials such as ethylcellulose, methylcellulose, polystyrene, and so forth are satisfactory for this purpose. A wetting agent is included in the organic vehicle to wet the surface of the glass frit particles as well as the surface of the electrical device to promote good adhesion of the glass frit to the surface of the electrical device. The organic vehicle should also include a solvent to adjust the viscosity as required for the particular method of application to be employed to apply the mixture to the surface of the electrical device.

All of the organic constituents of the organic vehicle are selected so as to be completely converted on reaction with a suitable plasma to gaseous reaction products such as carbon dioxide, carbon monoxide, water, or low molecular weight hydrocarbon gases at temperatures substantially below the thermal decomposition temperature of the organic vehicle. Ideally, the organic components of the organic vehicle, if not readily volatilized during low temperature drying as explained below, should have a thermal decomposition temperature of not higher than 400° C.

The glass frit which is used should be chemically compatible with the other materials employed in the manufacture of the electrical device and the environment in which the electrical device will be utilized. The glass frit particles should have as small a particle size as feasible in order to insure good particle packing on the surface of the electrical device. The glass transition temperature of the frit should also be substantially higher than the thermal decomposition temperature of the organic vehicle, and preferably should be about 700° to 1000° C.

To form the glass coating on the surface of the electrical device a mixture of the glass frit and the organic vehicle having the required composition is applied in a continuous layer over the surface of the electrical device. The mixture can be applied by silk screening, spraying, dipping, or the like. The substrate is then preferably dried at about 100° C. to remove the volatile materials from the mixture.

The electrical device with the dried layer of material on its surfaces is then subjected to treatment with a plasma which will react with the organic vehicle in the layer of material to convert the organic vehicle into gaseous products at temperatures below the thermal decomposition temperature of the organic vehicle and preferably at temperatures between 100° and 150° C.

The plasma can be generated by using plasma reactors of various well-known conventional designs. The plasma can be an oxidizing plasma formed using oxygen or a mixture of oxygen with an inert gas such as argon. The oxygen or oxygen-containing gas mixture is continuously introduced into the plasma reactor and the gaseous reaction products are continuously removed. The plasma readily penetrates the relatively porous layer of the glass frit and the organic vehicle and reacts with the organic vehicle. The resulting reaction gases readily escape from the porous layer. The plasma reaction is continued until substantially all the organic vehicle is removed as indicated by a loss of weight of the substrate having the layer formed thereon or by monitoring the exhaust gases until they are free of carbon-oxygen reaction products.

In an alternate embodiment of this invention, the organic vehicle is removed with a reducing plasma, such as a plasma formed with hydrogen, water gas, or a mixture thereof with an inert gas such as argon. A reducing plasma is particularly effective if there are oxidizable materials on the surface of the electrical device. The reducing plasma not only does not oxidize the oxidizable materials but it may also remove any residual oxides on the materials during the plasma reaction. The reducing plasma reaction is continued until substantially all the organic vehicle is removed from the layer on the electrical devices.

In an additional embodiment of this invention, a thick film ink layer which includes an organic vehicle which is readily removed, either by heating the layer to the thermal oxidation temperature of the organic vehicle or by subjecting the layer to an oxidizing plasma, and which also contains readily oxidizable components on the surface of the device, can be highly successfully treated in accordance with this invention by including a separate reducing plasma step in the method. In this embodiment, the readily oxidizable organic vehicle is initially removed by heating the layer in an oxidizing atmosphere up to the thermal degradation temperature of the organic vehicle and maintained there until all the organic vehicle is removed. The organic vehicle can also be removed by subjecting the thick film layer to an oxidizing plasma until all the organic vehicle is removed from the layer. The layer is then subjected to a reducing plasma, such as a hydrogencontaining plasma, until the readily oxidized components on the surface are reduced to a substantially non-oxidized state. Then the residual layer of glass frit and the particulate material is fired in a nitrogen or other inert atmosphere.

After the plasma reaction is completed, the layer on the electrical device consists substantially of glass frit particles. Surprisingly, however, despite the removal of the organic vehicle the particles of glass frit remain in position on the substrate. This may be due to a packing effect or may be the result of forces developed between the individual particles or a combination of both effects.

The substrate with the layer of glass frit on the surface thereof is fired at an elevated temperature, i.e., above the thermal decomposition temperature of the organic vehicle and at least at the glass transition temperature of the glass frit until the glass frit particles fuse together to form a continuous layer of glass over the surface of the electrical device. The resulting layer of glass will be free of residual organic materials, pinholes, and other similar defects and will provide a hermetic sealing, protective coating on the surface of the electrical device on which it is formed.

What is claimed is:

1. A method for forming a continuous glass coating on the surface of an electrical device comprising the steps of:
    (a) providing a mixture consisting essentially of (i) an organic vehicle which is reactive with a suitable plasma to form gaseous reaction products at a temperature below the thermal degradation temperature of the organic vehicle and (ii) a fuseable glass frit having a glass transition temperature above the thermal decomposition temperature of the organic vehicle;
    (b) forming a continuous layer of the mixture over the surface of the electrical device;
    (c) subjecting the layer to a plasma at a temperature below the thermal decomposition temperature of the organic vehicle for a time sufficient to react with all of the organic vehicle in said layer and removing the gaseous products from the layer; and
    (d) firing the layer at a temperature of at least the glass transition temperature of the glass frit until the glass frit fuses into a continuous glass coating on the surface of the electrical device.

2. In the method according to claim 1 wherein the organic vehicle is reactive with an oxidizing plasma and said plasma is an oxygen-containing plasma.

3. The method according to claim 2 wherein the plasma is an oxygen plasma.

4. The method according to claim 1 wherein the organic vehicle is reactive with a reducing plasma and the plasma is a hydrogen-containing plasma.

5. In the method according to claim 4 wherein the plasma is a hydrogen plasma.

6. In the method according to claim 1 wherein the organic vehicle is reactive with an oxidizing plasma and the surface of the electrical device includes readily oxidizable components, the steps of removing the organic vehicle with an oxidizing plasma and thereafter subjecting the layer to a reducing plasma until the readily oxidizable components of the electrical device are reduced to a substantially unoxidized state.

* * * * *